(12) United States Patent
Hutton et al.

(10) Patent No.: US 7,176,718 B1
(45) Date of Patent: Feb. 13, 2007

(54) ORGANIZATIONS OF LOGIC MODULES IN PROGRAMMABLE LOGIC DEVICES

(75) Inventors: Michael D Hutton, Mountain View, CA (US); Bruce Pedersen, Sunnyvale, CA (US); Sinan Kaptanoglu, Belmont, CA (US); David Lewis, Toronto (CA); Tim Vanderhoek, Toronto (CA)

(73) Assignee: Altera Corporation, San Jose, CA (US)

( * ) Notice: Subject to any disclaimer, the term of this patent is extended or adjusted under 35 U.S.C. 154(b) by 188 days.

(21) Appl. No.: 11/040,457

(22) Filed: Jan. 21, 2005

(51) Int. Cl.
*H03K 19/177* (2006.01)

(52) U.S. Cl. .......................................... 326/41; 326/47

(58) Field of Classification Search ............ 326/37–41, 326/47
See application file for complete search history.

(56) References Cited

U.S. PATENT DOCUMENTS

| | | | |
|---|---|---|---|
| 5,260,610 A | 11/1993 | Pedersen et al. | |
| 5,260,611 A | 11/1993 | Cliff et al. | |
| 5,371,422 A * | 12/1994 | Patel et al. | ................... 326/41 |
| 5,689,195 A | 11/1997 | Cliff et al. | |
| 5,909,126 A | 6/1999 | Cliff et al. | |
| 5,963,049 A | 10/1999 | Cliff et al. | |
| 5,977,793 A | 11/1999 | Reddy et al. | |
| 5,982,195 A | 11/1999 | Cliff et al. | |
| 5,999,016 A | 12/1999 | McClintock et al. | |
| 6,215,326 B1 | 4/2001 | Jefferson et al. | |
| 6,249,143 B1 * | 6/2001 | Zaveri et al. | ................... 326/40 |
| 6,294,928 B1 * | 9/2001 | Lytle et al. | ................... 326/41 |
| 6,407,576 B1 | 6/2002 | Ngai et al. | |
| 6,605,962 B2 | 8/2003 | Lee et al. | |

* cited by examiner

*Primary Examiner*—James H. Cho
(74) *Attorney, Agent, or Firm*—Fish & Neave IP Group of Ropes & Gray LLP; Robert R. Jackson

(57) ABSTRACT

A programmable logic element grouping for use in multiple instances on a programmable logic device includes more than the traditional number of logic elements sharing secondary signal (e.g., clock, clock enable, clear, etc.) selection circuitry. The logic elements in such a grouping are divided into at least two subgroups. Programmable interconnection circuitry is provided for selectively applying signals from outside the grouping and signals fed back from the logic elements in the grouping to primary inputs of the logic elements in the grouping. The programmable interconnection circuitry limits possible application of at least some of these signals to one or the other of the subgroups, and/or provides for possible application of at least some of these signals to a greater percentage of the primary inputs to one of the subgroups than to the other.

22 Claims, 12 Drawing Sheets

ORGANIZATIONS OF LOGIC MODULES IN PROGRAMMABLE LOGIC DEVICES

BACKGROUND OF THE INVENTION

This invention relates to programmable logic devices ("PLDs"), and more particularly to more economical clustering of logic modules and related circuitry in PLDs.

A PLD may include a large number of relatively small modules of programmable logic. For example, each such logic module ("LM") or logic element ("LE") may include a four-input look-up table ("LUT"), a register (e.g., for selectively registering an output signal of the LUT), and a small amount of other circuitry (e.g., for determining whether and how the register is used, for selecting control signals for the register, etc.). The LUT may be programmable to produce an output signal that is any logical combination or function of the four inputs to the LUT. The LE may be programmable with respect to whether and how the register is used, and what control signals (e.g., clock, clock enable, clear, etc.) are selected for application to the register.

In addition to the LEs, a PLD typically includes programmable interconnection circuitry for conveying signals to, from, and/or between the LEs in any of many different ways. This allows the relatively simple logic capabilities of individual LEs to be concatenated to perform logic tasks of considerable complexity.

It has been found helpful and economical to give the resources in PLDs—especially large PLDs—a hierarchical organization. For example, the LEs in a PLD may be clustered in groups that may be called logic array blocks or LABs. The LEs in a LAB share certain resources associated with the LAB. These shared resources may include such things as LAB input multiplexers ("LIMs"), which are programmable to select signals from nearby interconnection conductors so that those signals will be available as inputs to the LEs in the LAB. Another example of a resource that may be shared by the LEs in a LAB is so-called secondary signal ("SS") selection circuitry. This SS circuitry is programmable to select signals from nearby conductors so that these signals will be available as secondary signals (e.g., register clock, clock enable, and clear signals) for use by the LEs in the LAB.

The manner in which a hierarchical PLD organization is implemented and the manner in which resources are shared by clusters of LEs in such a hierarchy can have a significant impact on the efficiency with which the "real estate" of the PLD is utilized. Improvements are therefore always being sought in this aspect of PLD design.

SUMMARY OF THE INVENTION

In accordance with the invention a programmable logic element grouping or LAB for use in multiple instances on a programmable logic device or PLD includes more than the traditional number of logic elements or LEs sharing secondary signal (e.g., clock, clock enable, clear, etc.) selection circuitry. The logic elements in such a grouping are preferably divided into at least two subgroups of plural logic elements. Programmable interconnection circuitry is provided for selectively applying signals from outside the grouping and signals fed back from the logic elements in the grouping to primary inputs of the logic elements in the grouping. The programmable interconnection circuitry limits its possible application of at least some of these signals to one or the other of the subgroups, and/or provides for possible application of at least some of these signals to a greater percentage of the primary inputs to one of the subgroups than to the other subgroup.

Another optional feature of the invention relates to providing "sneak" connections from the output of each LE in a subgroup to the programmable interconnection resources serving only selected LE subgroups, such as (a) the subgroup that includes the LE originating the sneak signal, (b) the other subgroup in the grouping that includes the first-mentioned subgroup, and/or (c) selected subgroups in adjacent or nearby groupings (e.g., the groupings to the left and right of the first-mentioned grouping). These sneak connections are preferably made as though from outside the grouping that originated the sneak signal, but preferably also without using the more general-purpose interconnection resources of the PLD (e.g., the interconnection conductors that are used for conveying signals to, from, and/or between the groupings generally).

Further features of the invention, its nature and various advantages, will be more apparent from the accompanying drawings and the following detailed description.

DETAILED DESCRIPTION

Figure 1:
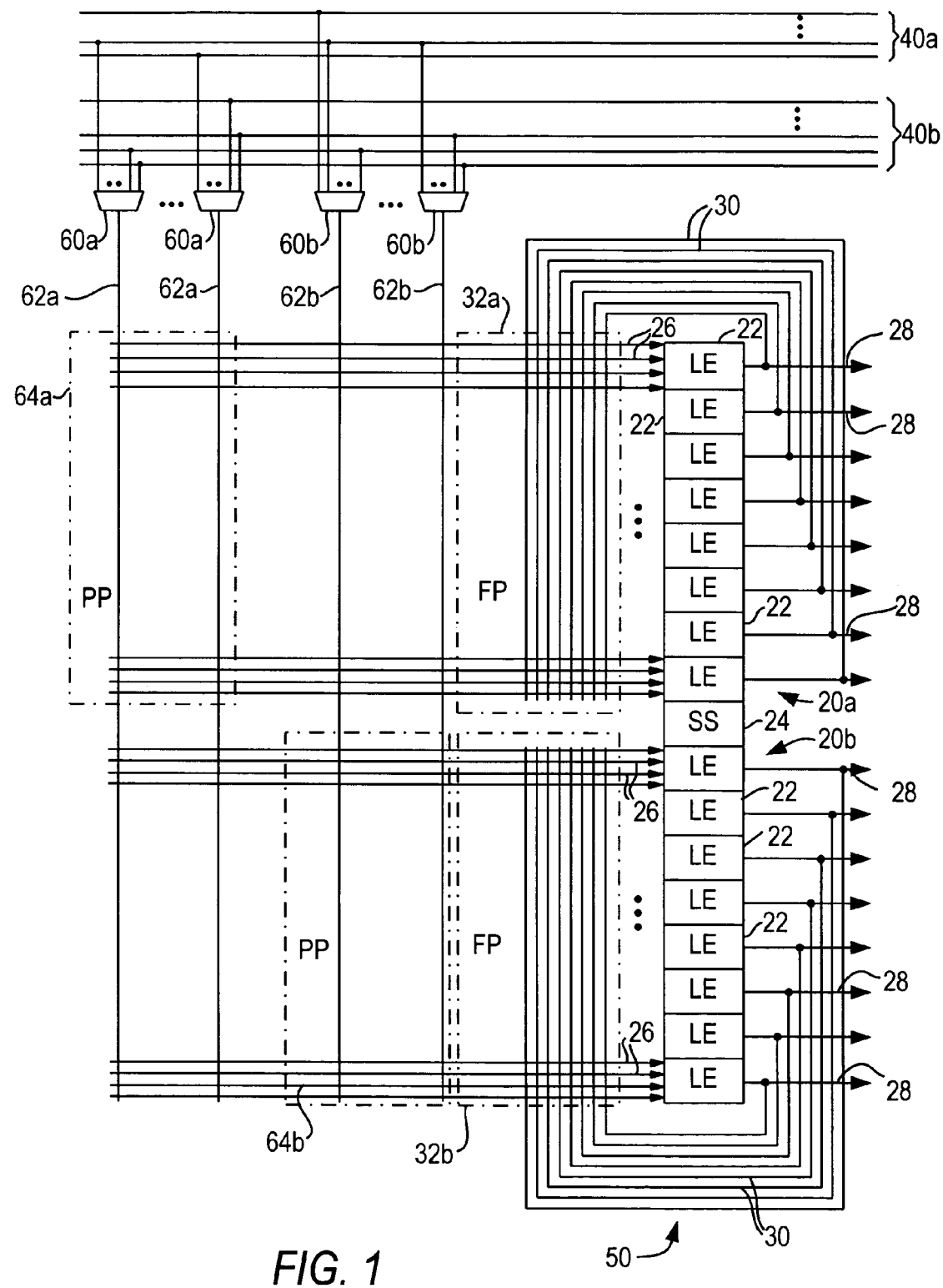
FIG. 1 is a simplified schematic block diagram of a representative portion of an illustrative embodiment of a PLD in accordance with the invention.

A representative portion of an illustrative embodiment of a PLD in accordance with the invention is shown in FIG. 1. The FIG. 1 circuitry includes the following: (1) two subgroups 20a and 20b of LEs 22 (in this example there are eight LEs 22 in each subgroup 20; each LE can be as described in the Background section of this specification); (2) secondary signal ("SS") selection circuitry 24 common to or shared by both subgroups 20 of LEs 22; (3) several (e.g., four) primary input conductors 26 to each LE 22; (4) at least one output conductor 28 from each LE 22; (5) local feedback conductors 30 from outputs 28 of the LEs 22 in each subgroup 20 for possible inputting to LEs in that subgroup; (6) two groups of interconnection conductors 40a and 40b (for example, one group may span a relatively large number of LABs 50 (defined below), and the other group may span a relatively small number of LABs 50; or one group may extend along a horizontal row of LABs 50, and the other group may extend along a vertical column of LABs 50); (7) two groups of LAB input multiplexers ("LIMs") 60a and 60b, each of which LIMs 60 is programmable to select the signal on one of several conductors 40 as the output signal 62 of that LIM; and (8) LE input multiplexer ("LEIM") circuitry 32a/32b/64a/64b for programmably selectively connecting conductors 30 and 62 to primary input conductors 26 of LEs 22.

Considering the LEIM circuitry in FIG. 1 in more detail, each LEIM ultimately supplies a signal to one LE input 26. The LEIMs for inputs 26 to LEs 22 in subgroup 20a include programmable connections from conductors 62a and from the conductors 30 feeding back from the LEs 22 in that subgroup 20a. Similarly, the LEIMs for inputs 26 to LEs 22 in subgroup 20b include programmable connection from conductors 62b and from the conductors 30 that feed back from the LEs 22 in that subgroup 20b. The regions of available programmable connections provided by the LEIMs are indicated within the chain-dotted lines 32a, 32b, 64a, and 64b. Some or all of the conductors intersecting within those regions 32 and 64 can be programmably interconnected by the LEIM circuitry. The extent of this interconnectivity is sometimes referred to as the population density of the interconnection region 32 or 64. For example, each region 32 may have a population density of 100%, meaning that any vertical conductor 30 in that region can be programmably connected to any horizontal conductor 26 in that region. Thus any local feedback conductor 30 entering a region 32 can be used as the source for any output signal 26 leaving that region. As another example, each region 64 may have a population density of about 50%, meaning that only about 50% of the conductor intersections in that region are locations at which the intersecting conductors can be programmably interconnected.

Figure 2:
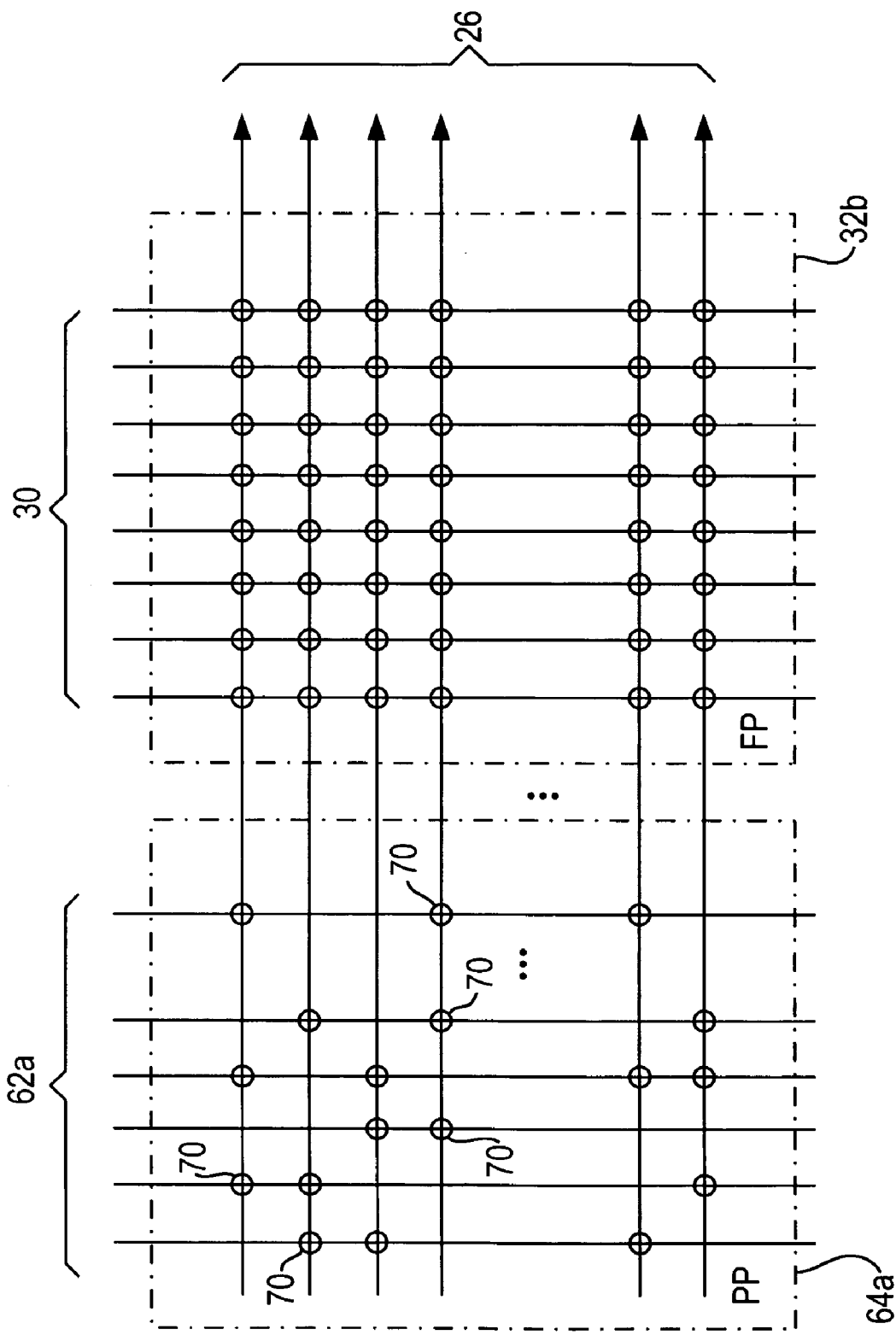
FIG. 2 is a more detailed (but still simplified) schematic block diagram of an illustrative embodiment of a portion of FIG. 1.

FIG. 2 illustrates the examples toward the end of the preceding paragraph in somewhat more detail. Each small circle 70 in FIG. 2 indicates a conductor intersection at which a programmable connection between the intersecting conductors can be made. Connections are not possible at uncircled conductor intersections. The population densities shown in FIG. 2 and described above are only examples, and other population densities can be used if desired. In FIG. 1 the 100% or full population of regions 32 is indicated by the letters FP in each of those regions, and the partial (e.g., 50%) population of regions 64 is indicated by the letters PP in each of those regions.

Note that in the example shown in FIG. 1 programmable interconnections are not provided between conductors 62b and the inputs 26 to LEs 22 in subgroup 20a. Similarly, programmable interconnections are not provided between conductors 62a and the inputs 26 to LEs 22 in subgroup 20b. Also, in this embodiment local feedback conductors 30 from each subgroup 20 can only be used to feed back signals to LEs in that same subgroup 20, not to LEs in the other subgroup 20.

A typical number of LIMs 60a to be provided is 2(n)+6, where n is the number of LEs 22 in subgroup 20a. Similarly, a typical number of LIMs 60b to be provided is 2(n)+6, where n is the number of LEs 22 in subgroup 20b. A typical size of each LIM is 30 to 1. Typical numbers of conductors in each subgroup 40a and 40b are 100 (for a total of 200 conductors 40). These examples are, of course, only illustrative, and other numbers and sizes of elements can be used instead if desired. The choices made may depend on such factors as overall device size, range of intended uses, etc.

The circuitry shown in FIG. 1 may be referred to as a LAB 50.

Figure 3:
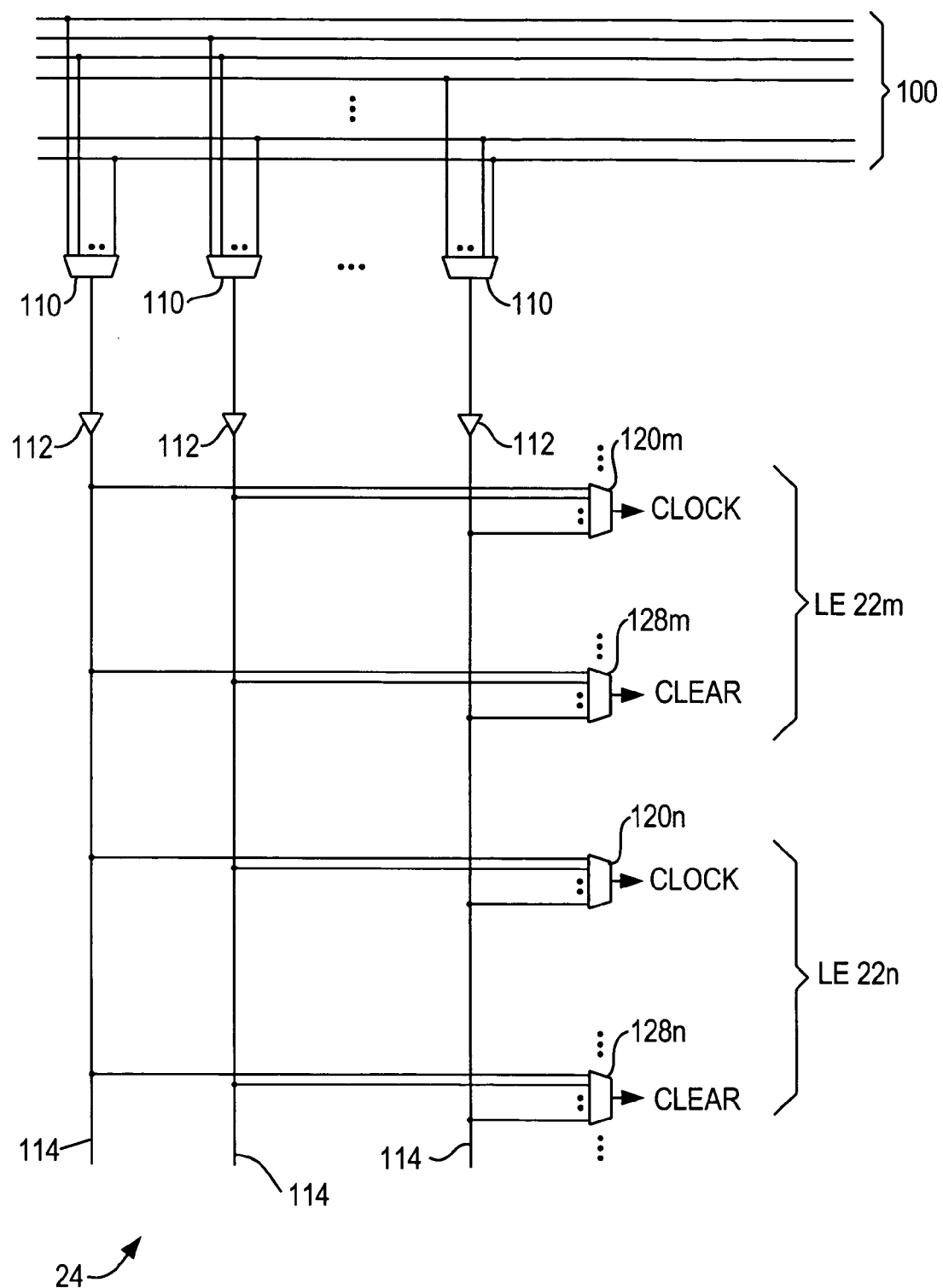
FIG. 3 is a more detailed (but still simplified) schematic block diagram of an illustrative embodiment of a portion of FIG. 1.

An illustrative embodiment of SS circuitry 24 that is part of a LAB 50 is shown in FIG. 3. This circuitry includes a plurality of secondary signal selection multiplexers 110 for programmably selecting candidate secondary signals from any of a plurality of sources such as conductors 100. Conductors 100 may include clock distribution network conductors for distributing several different clock signals throughout all or various parts of the device. Conductors 100 may also include global conductors for distributing several possible clear signals throughout all or various parts of the device. Other examples of secondary signals may include clock enable signals, reset signals, preset signals, etc. Some of conductors 100 may be the same as or similar to some of conductors 40. Some of sources 100 may be relatively local (i.e., available in only a portion of the device); other sources may be global (i.e., available substantially everywhere on the device).

The candidate secondary signals selected by multiplexers 110 are amplified by drivers 112 and are then available on LAB-wide conductors 114 for final, programmable selection on an LE-by-LE basis by multiplexers such as 120 and 128. For example, multiplexer 120m selects a clock signal to be used by the register in LE 22m (a representative one of LEs 22 in LAB 50 in FIG. 1). Multiplexer 128m selects a clear signal to be used by the register in LE 22m. Other multiplexers m may be provided for selecting other secondary signals for LE 22m (e.g., a register clock enable signal, a register preset signal, a register reset signal, etc.). Multiplexer 120n selects a clock signal for LE 22n (another representative one of LEs 22 in LAB 50 in FIG. 1). Multiplexer 128n selects a clear signal for LE 22n.

SS circuitry 24 can be a relatively "expensive" resource (e.g., in terms of area occupied and power consumed). For example, drivers 112 may need to be relatively large and powerful because they are handling signals that tend to be speed-critical and because the outputs of drivers 112 go to large numbers of destinations. The LAB architecture shown in FIG. 1 is therefore advantageous because two subgroups 20a and 20b of LEs 22 share one SS circuit region 24. In other respects the circuitry shown in FIG. 1 is somewhat like two eight-LE LABs. In other words, each subgroup 20a and 20b of eight LEs 22 has its own local feedback circuitry 30 and 32a or 32b, and its own LIM circuitry 60a/62a/64a or 60b/62b/64b. But rather than duplicating relatively expensive SS circuitry 24 for each subgroup 20a and 20b, one instance of SS circuitry 24 serves both subgroups 20a and 20b. Accordingly, at least in respect of SS circuitry 24, LAB 50 is a 16-LE LAB.

Figure 4:
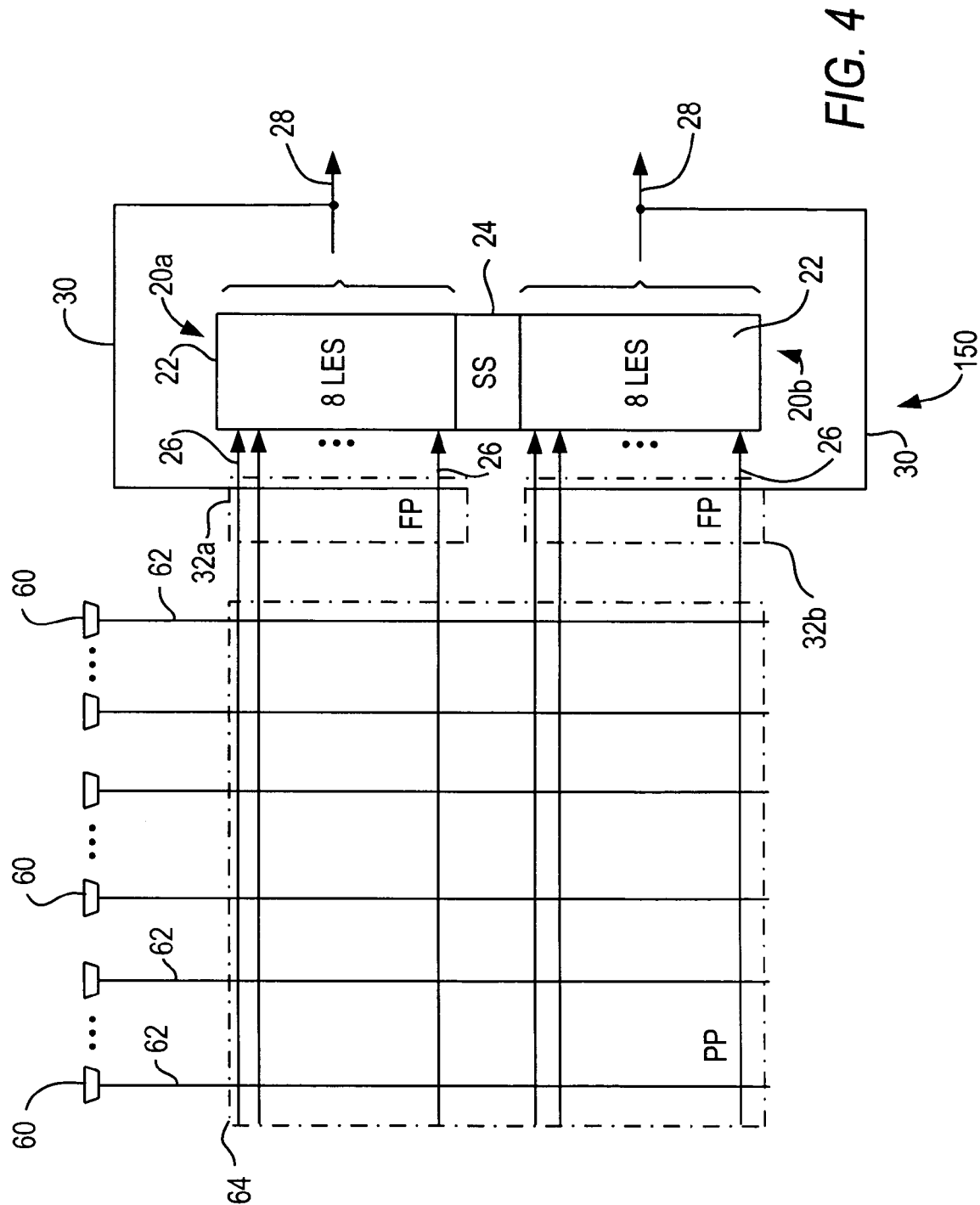
FIG. 4 is generally similar to FIG. 1 for another illustrative embodiment in accordance with the invention.

FIG. 4 shows an alternative embodiment of a LAB 150 in accordance with the invention. FIG. 4 is intended to show circuitry that is generally similar to the circuitry shown in FIGS. 1–3, but some simplifications in the depiction are made in FIG. 4 to avoid unnecessarily repeating details that will now be fully understood from the earlier discussion. For example, conductors 40 and the inputs from those conductors to LIMs 60 are not shown again in FIG. 4 to avoid unnecessary repetition. Similarly, LEs 22 are not shown individually in FIG. 4, nor are LE outputs 28 and local feedback conductors 30. These multiple elements are "bused" together in the FIG. 4 depiction to simplify the FIG.

The major difference between the FIG. 4 and FIG. 1 embodiments is that in FIG. 4 all of LIM 60 outputs 62 are available to both subgroups 20a and 20b of LEs 22. Thus LAB 150 is constructed with respect to LIMs 60 (as well as with respect to SS circuitry 24 (which can be unchanged from FIGS. 1–3)) as a 16-LE LAB. This can produce economies with respect to numbers of LIMs 60 and LEIM size. For example, if the rule that 2(n)+6 LIMs are needed, then the embodiment shown in FIG. 4 needs 2(16)+6=38 LIMs 60. In contrast, the embodiment shown in FIGS. 1–3 needs 2(8)+6+2(8)+6=44 LIMs 60. Assuming the same population density (e.g., 50%) in all of programmable interconnection regions 64 throughout FIGS. 1–4, the LEIMs in FIG. 4 can be smaller than in FIGS. 1–3 because the number of conductors 62 (and therefore the number of inputs to each LEIM) can be smaller in FIG. 4.

Other than the differences noted above, the embodiment of FIG. 4 can be similar to the FIG. 1 embodiment.

Figure 5:
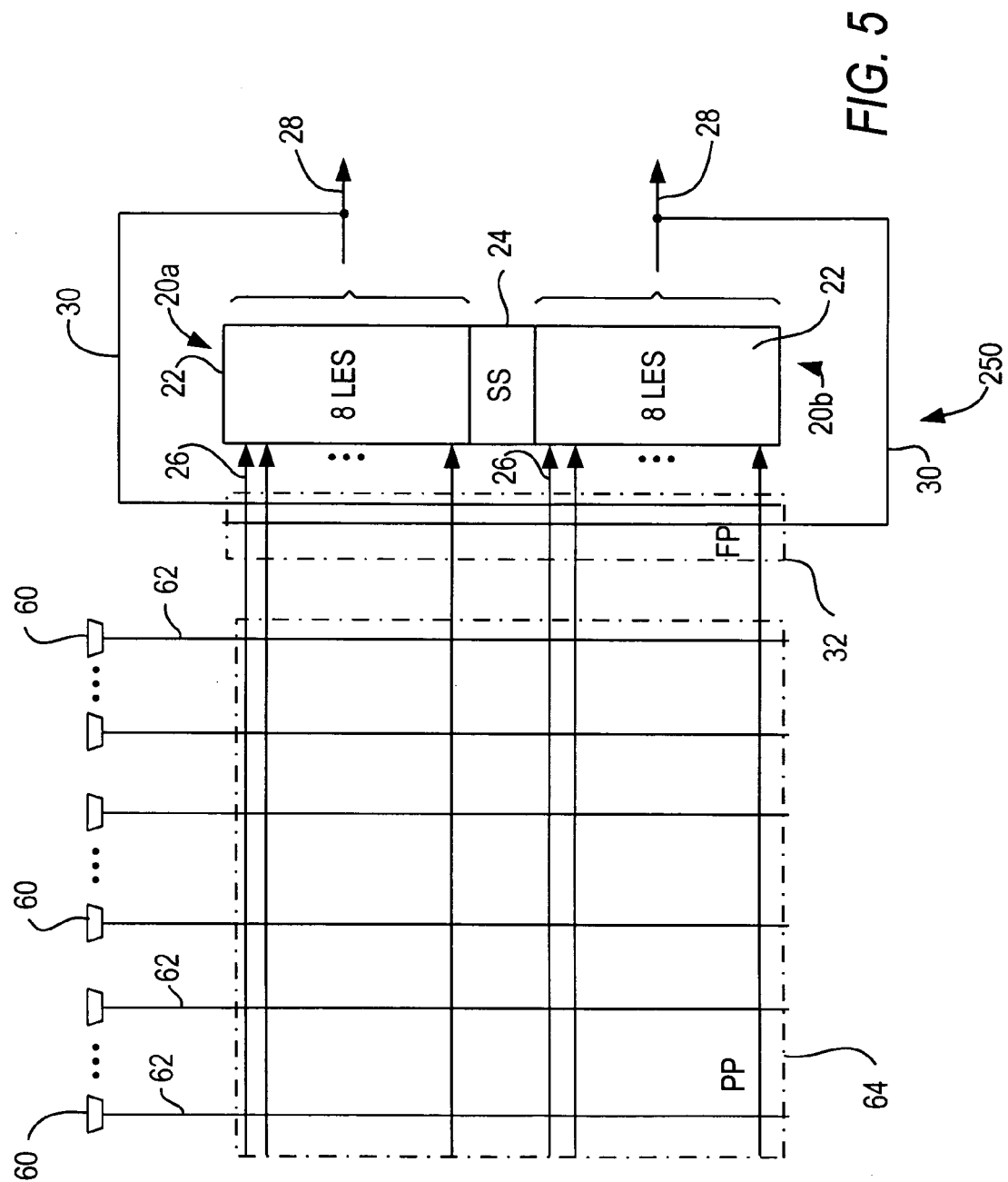
FIG. 5 is generally similar to FIG. 4 for still another illustrative embodiment in accordance with the invention.

FIG. 5 shows another illustrative embodiment ("LAB 250"), which can be described relatively briefly with reference to changes made from FIG. 4. In FIG. 5 the outputs of all 16 LEs 22 in the LAB are fed back for equal availability as inputs to all of those LEs via programmable interconnect region 32. LAB 250 is therefore a 16-LE LAB for substantially all purposes (i.e., with respect to LIMs 60, local feedback 30, and SS circuitry 24 sharing). It will be appreciated that this may tend to increase LEIM size because each LEIM now has the potential for 16 local feedback inputs 30, rather than only eight such inputs. This last point may be somewhat ameliorated by the embodiment shown in FIG. 6, which will now be described.

Figure 6:
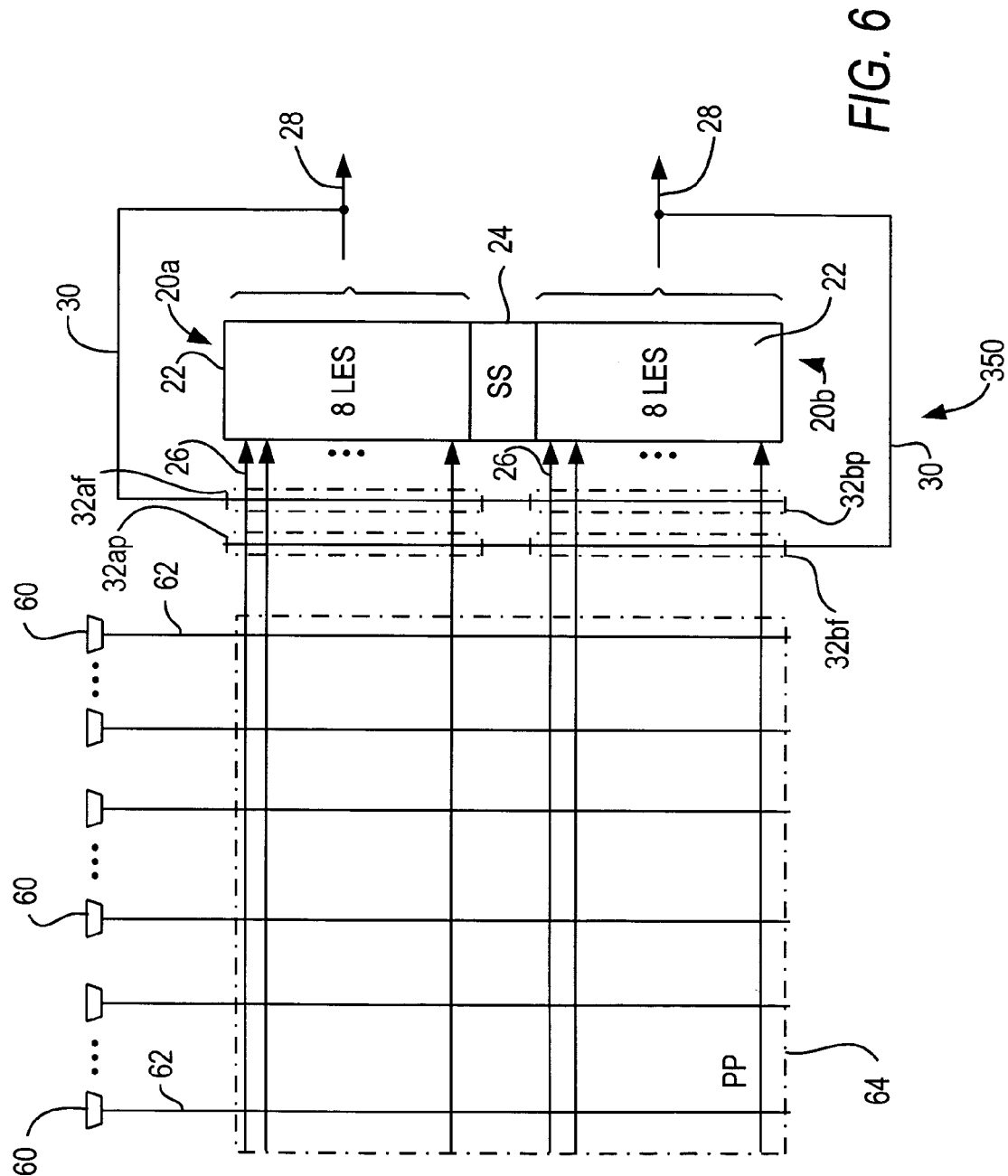
FIG. 6 is generally similar to FIG. 5 for yet another illustrative embodiment in accordance with the invention.

The alternative embodiment shown in FIG. 6 ("LAB 350") is similar to the embodiment shown in FIG. 5, except that the programmable interconnection region 32ap between the local feedback conductors 30 from LE subgroup 20b to inputs 26 for LE subgroup 20a is only partially populated, rather than fully populated as in the case of region 32af (for local feedbacks 30 from LEs in subgroup 20a to LEs in that subgroup). Similarly, region 32bp (for feedbacks from LE subgroup 20a to LE subgroup 20b) is only partially populated, rather than fully populated as in the case of region 32bf (for feedback from LE subgroup 20b to that same subgroup). For example, regions 32ap and 32bp may have population densities of 50%, while regions 32af and 32bf may be fully populated (100% population density). The less than full population of regions 32ap and 32bp reduces the size of the LEIMs as compared to the embodiment shown in FIG. 5.

At this point it may be worth mentioning again that population densities mentioned throughout this specification are only examples, and that other population densities may be used if desired. As an example of this in the context of FIG. 6, the regions 32af and 32bf described as fully populated may alternatively be less than fully populated. In general, however, regions 32af and 32bf will tend to have higher population densities than regions 32ap and 32bp.

Figure 7:
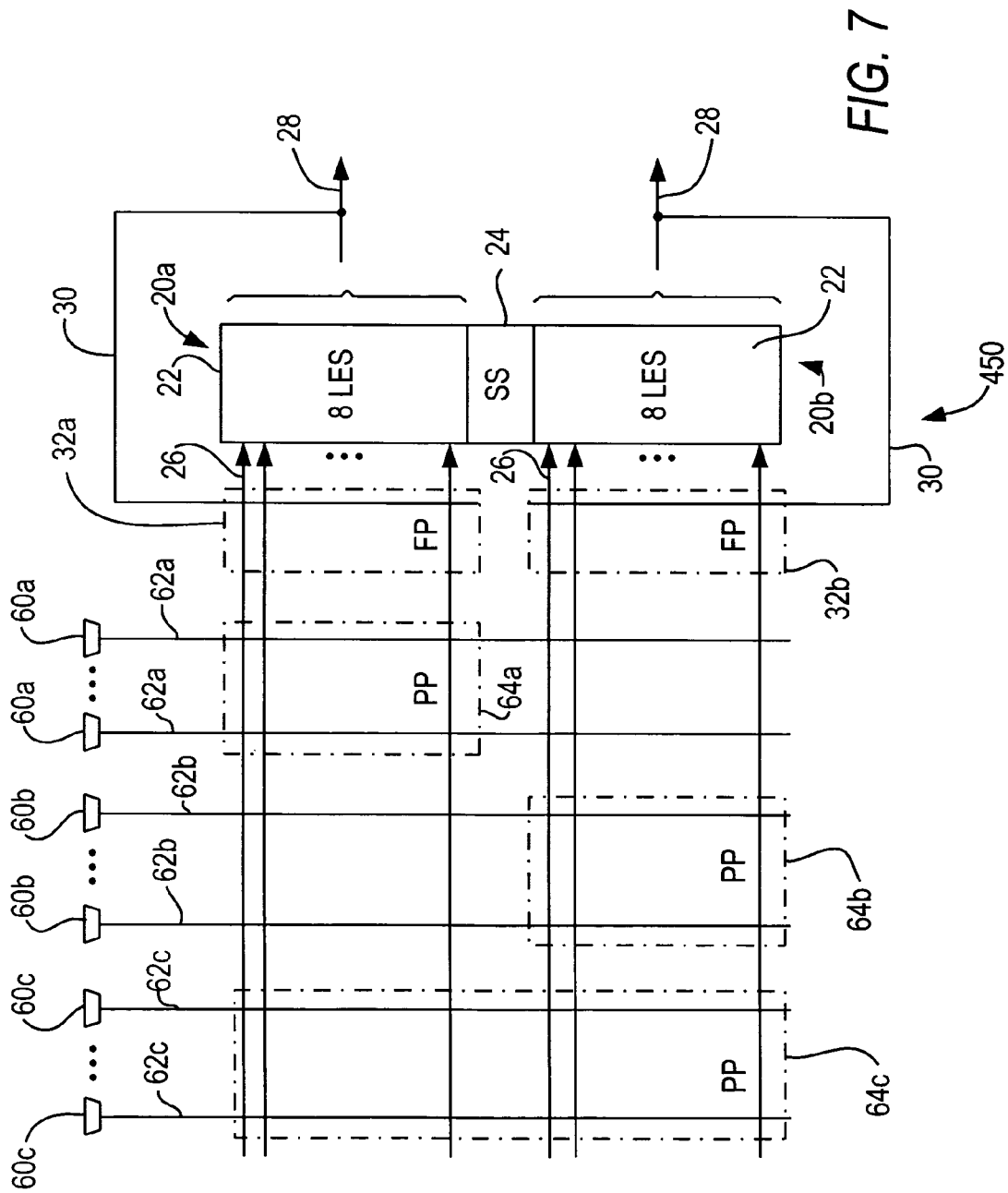
FIG. 7 is generally similar to FIG. 6 for still another illustrative embodiment in accordance with the invention.

FIG. 7 shows another possible embodiment ("LAB 450"). This embodiment may be most easily compared to the embodiment shown in FIG. 4 because the handling of local feedback conductors 30 can be the same in both of these embodiments. FIG. 7 has some LIMs 60a that are only usable to supply signals to LE subgroup 20a (via programmable interconnection region 64a), some LIMs 60b that are only usable to supply signals to LE subgroup 20b (via programmable interconnection region 64b), and some LIMs 60c that are usable to supply signals to either or both of LE subgroups 20a and 20b (via programmable interconnection region 64c). Assuming, for example, that 2(n)+6 is the general rule being followed in determining the appropriate number of LIMs, that rule is slightly modified in the case of FIG. 7 as follows: Half of the 2n (where n equal 16) LIMs are provided as LIMs 60a; the other half of the 2n LIMs are provided as LIMs 60b; and there are six LIMs 60c. Another way of looking at this allocation of the LIMs is that each half-LAB has 2n+6 LIMs 60a/60c or 60b/60c (n now being eight instead of 16 because only half of the LAB is considered at any one time), but the six LIMs 60c are shared by both half-LABs.

Assuming that all of regions 64a–c in FIG. 7 have the same population density as region 64 in FIG. 4, and further assuming that regions 32a and 32b are the same in both of these FIGS., then FIG. 7 allows the use of smaller LEIMs than FIG. 4. For example, assuming 50% population density in all of regions 64 in both FIG. 4 and FIGS. 7, and 100% population density in all of regions 32 in these FIGS., then a typical LEIM in FIG. 4 has (2n+6)(0.5)+8=27 inputs, while a typical LEIM in FIG. 7 has only (2(n/2)+6)(0.5)+ 8=19 inputs (n being 16 in both expressions in this sentence).

Figure 8:
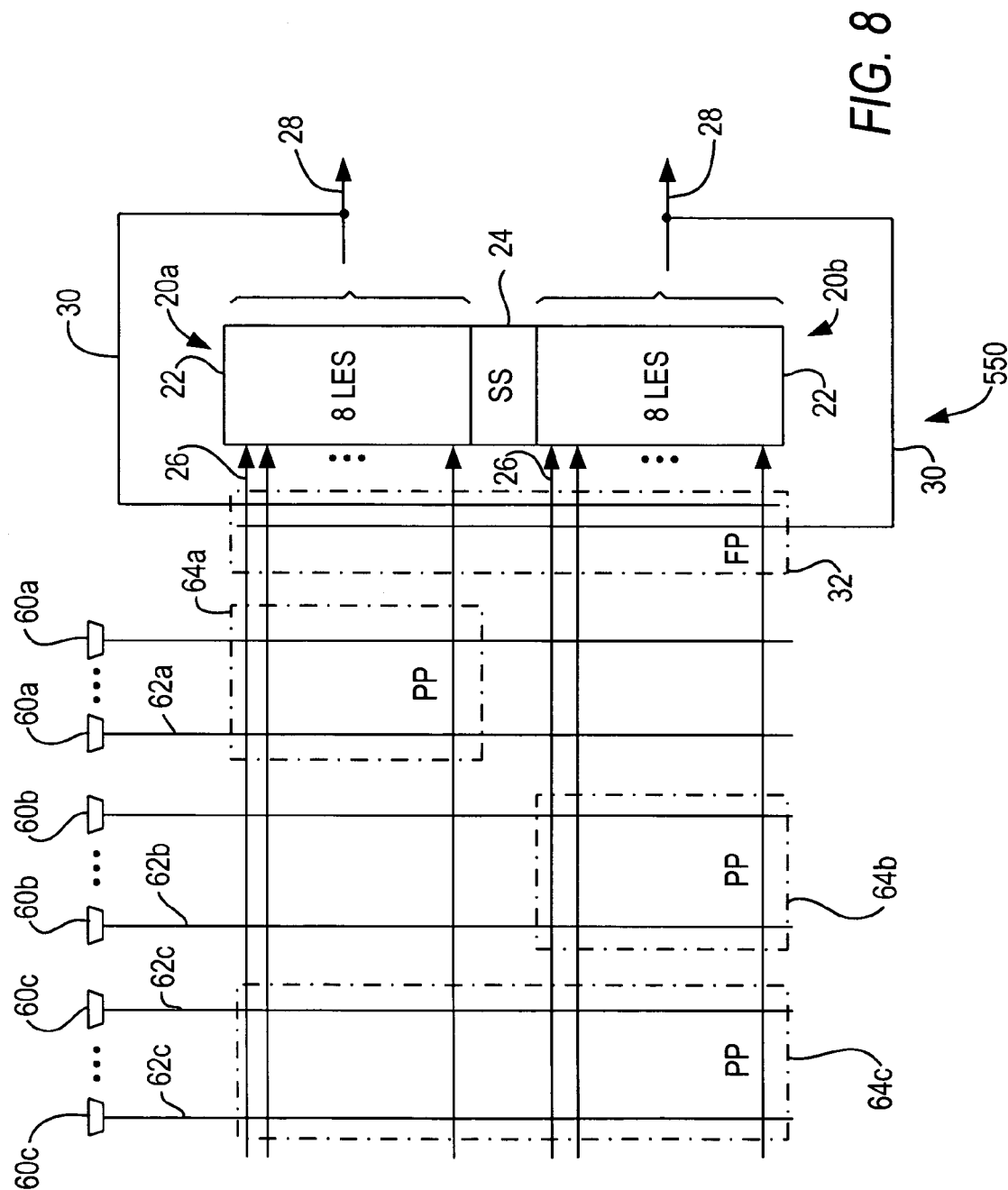
FIG. 8 is generally similar to FIG. 7 for yet another illustrative embodiment in accordance with the invention.

FIG. 8 shows yet another embodiment ("LAB 550") that basically combines the LIM 60a–c approach of FIG. 7 with the local feedback 30 approach of FIG. 5. FIG. 8 tends to enlarge LEIM size as compared to FIG. 4, but to reduce LEIM size as compared to FIG. 5.

Figure 9:
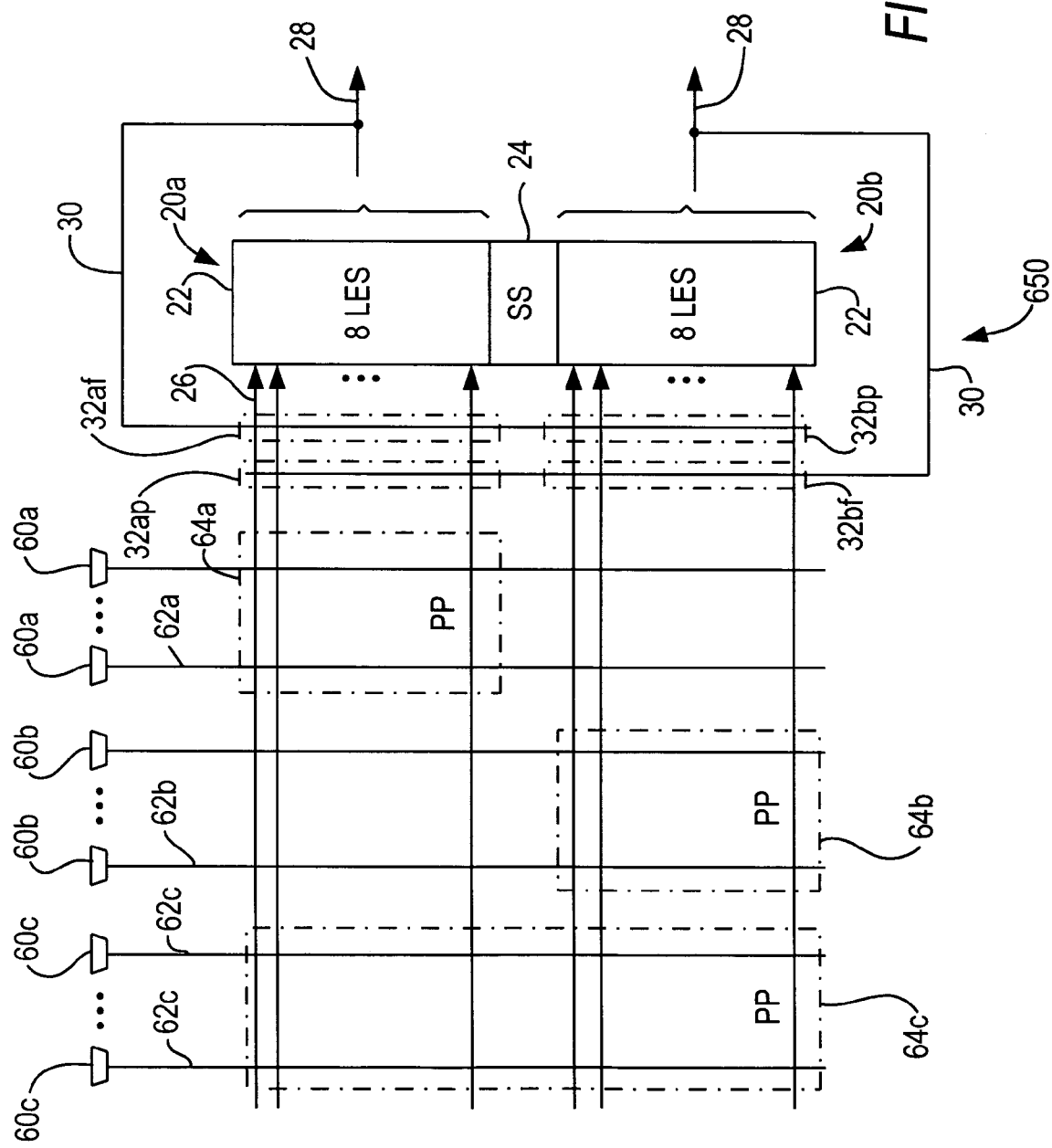
FIG. 9 is generally similar to FIG. 8 for still another illustrative embodiment in accordance with the invention.

FIG. 9 shows still another embodiment ("LAB 650") that basically combines the LIM 60a–c approach of FIG. 7 with the local feedback 30 approach of FIG. 6. FIG. 9 tends to enlarge LEIM size as compared to FIG. 4 (although not as much as FIG. 8), but to reduce LEIM size as compared to FIG. 6.

Summarizing the foregoing to some extent, all of FIGS. 1–9 have the advantage of economy due to sharing of SS circuitry 24 by a relatively large number of LEs. As compared to FIGS. 1–3, FIGS. 4–9 offer additional advantages or economies (to varying degrees) due to reduction in the number of LIMs 60 and/or reduction in LEIM size.

Another possible advantage of embodiments like those shown in FIGS. 7–9 is the following: LIMs 60 having outputs with fewer taps tend to provide faster routing than LIMs 60 having outputs with more taps. Thus in any of FIGS. 7–9 routing through a LIM 60a or 60b tends to be faster to an LE 22 than routing through a LIM 60c. It can be helpful to have available such alternative fast and slow routing into an LE 22. For example, fast routing can be used for a signal that is subject to more upstream delay, and slow routing can be used for a signal that is subject to less upstream delay, thereby tending to equalize overall propagation time. Alternatively or in addition, fast routing can be used for a signal that will be handled relatively slowly by the receiving LE 22, and slow routing can be used for a signal that the LE 22 will handle more quickly, thereby helping to even out differences in LE response time for different inputs to the LE.

Figure 10:
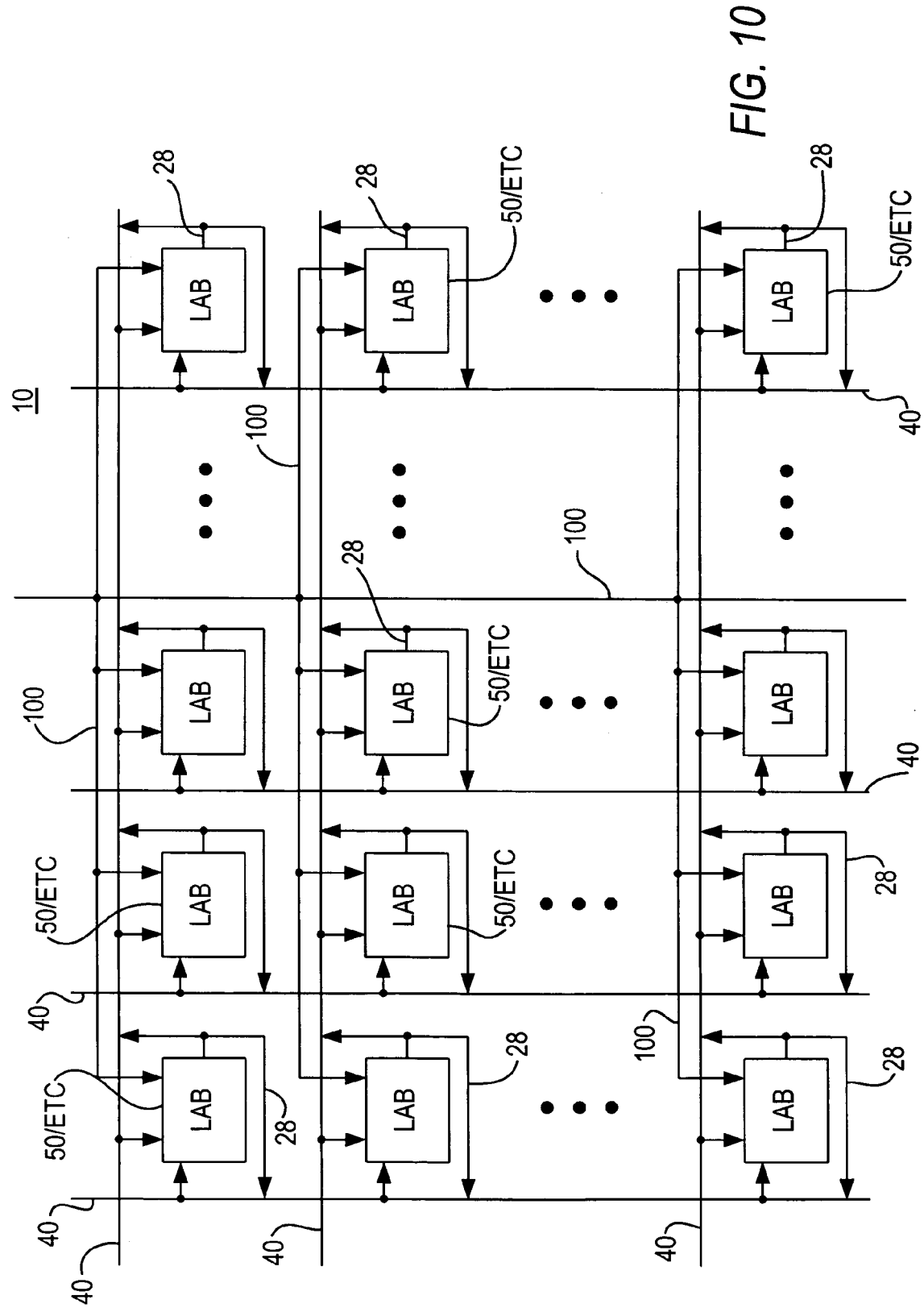
FIG. 10 is a simplified block diagram of an illustrative embodiment of more extensive circuitry in accordance with the invention.

FIG. 10 shows an illustrative embodiment of a PLD 10 including multiple instances of LABs, each of which can have any of the configurations 50, 150, 250, 350, 450, 550, or 650 shown and described herein. In the illustrative embodiment shown in FIG. 10, LABs 50/ETC are disposed on PLD 10 in a two-dimensional array of intersecting rows and columns. Each row and column has an associated group of horizontal and vertical conductors 40. Secondary signal distribution network 100 conveys at least some secondary signals to the SS circuitry 24 of each LAB.

Figure 11:
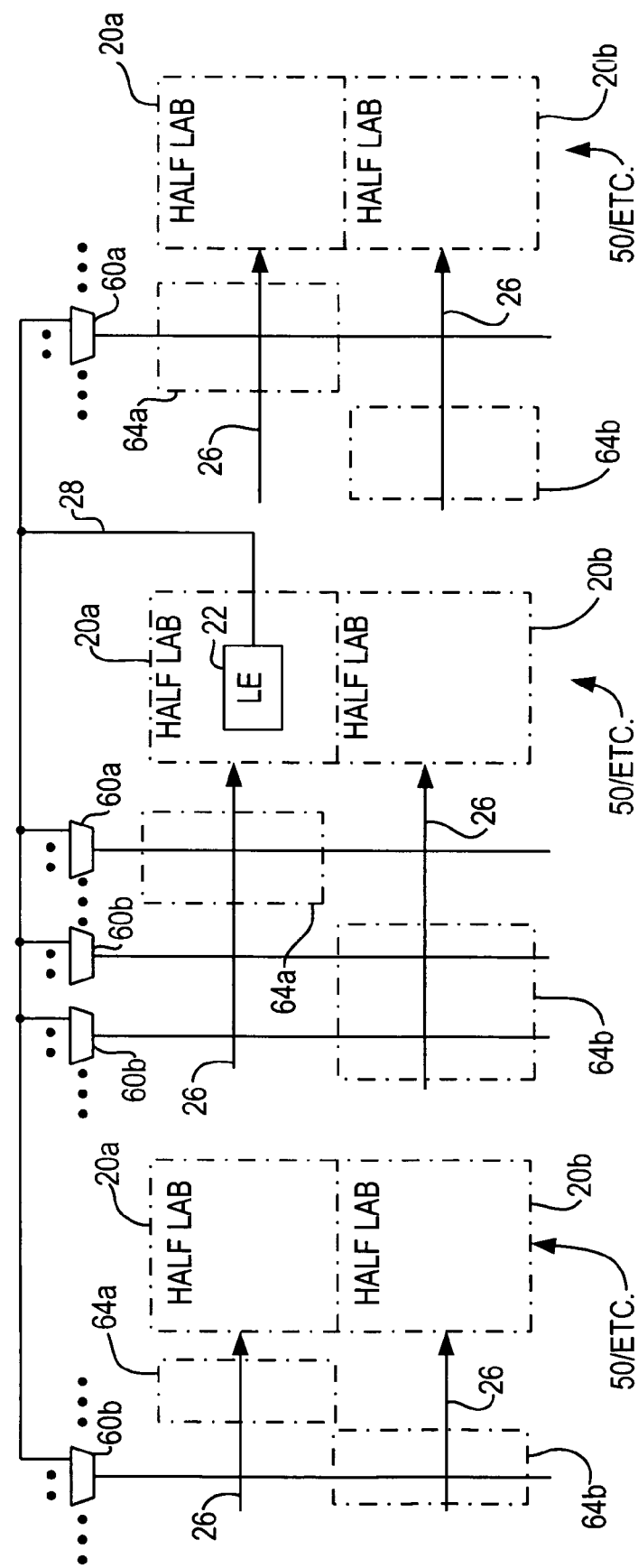
FIG. 11 is a more detailed (but still simplified) schematic block diagram of a representative portion of FIG. 10 in accordance with a further optional feature of the invention.

Another optional aspect of the invention is illustrated by FIG. 11. This relates to the provision of certain "sneak" connections back into a LAB and/or from one LAB to one or more adjacent or nearby LABs (e.g., on a PLD like PLD 10 in FIG. 10). A sneak connection is from an LE output 28 to an input of a LIM 60 without using any of the more general interconnection resources of the device to make that connection. For example, none of more global interconnection resources 40 on device 10 are used to make a sneak connection.

In the illustrative embodiment shown in FIG. 11 each LE in each half-LAB 20a or 20b in each LAB 50/ETC has the following sneak connections: (a) one to the same half-LAB in the same LAB; (b) two to the other half-LAB in the same LAB; (c) one to a pseudo-randomly chosen half-LAB in the LAB to the right; and (d) one to a pseudo-randomly chosen half-LAB in the LAB to the left. For the representative LE 22 shown in FIG. 11, which happens to be in half-LAB 20a in center LAB 50/ETC, the possible sneak connections are (a) one through a LIM 60a and interconnection region 64a back to half-LAB 20a in the center LAB; (b) two through LIMs 60b and interconnection region 64b back to half-LAB 20b in the center LAB; (c) one through a LIM 60a and interconnection region 64a to half-LAB 20a in the LAB to the right (this could alternatively have been through elements 60b and 64b to half-LAB 20b in the LAB to the right); and (d) one through a LIM 60b and interconnection region 64b to half-LAB 20b in the LAB to the left (this could alternatively have been through elements 60a and 64a to half-LAB 20a in the LAB to the left).

Sneak connections of the type described above may make use of otherwise unoccupied conductor track segments on a PLD. Sneak connections are preferably in addition to other interconnection resources on the PLD, especially the local feedback resources 30 of the PLD. The particular arrangement of sneak connections shown in FIG. 11 is only illustrative, and other arrangements are also possible.

Figure 12:
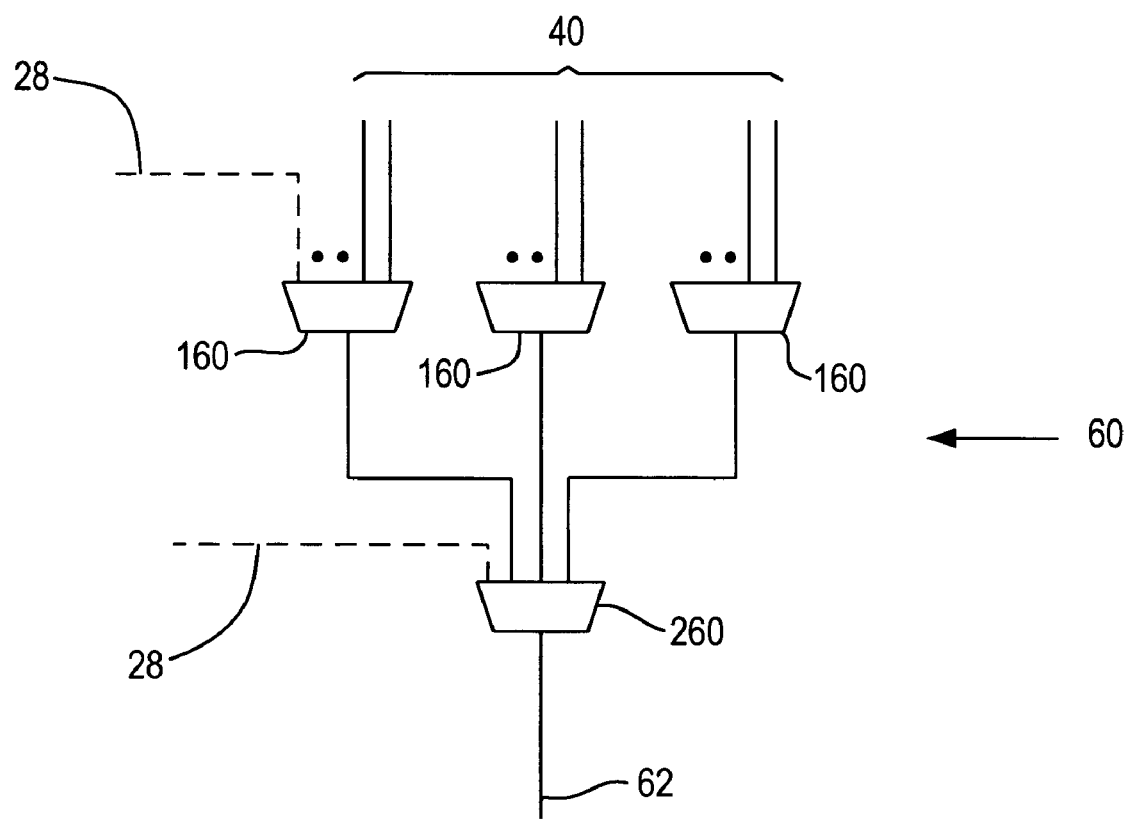
FIG. 12 is a more detailed (but still simplified) schematic block diagram of a representative portion of FIG. 11 showing alternative implementations of the optional feature in accordance with the invention.

The LIMs 60 in a PLD may be two-stage multiplexers. FIG. 12 shows an example of such a two-stage LIM 60 in which a first level of selection is made by first-stage multiplexers 160 and a second level of selection is made by second-stage multiplexer 260. FIG. 12 shows that a sneak connection 28 can be applied to such a LIM via either its first or second stage. Applying a sneak connection 28 to the second stage multiplexer 260 in a LIM makes the sneak signal available sooner on LIM output 62 than if the sneak connection is applied to a first stage multiplexer 160.

It will be understood that the foregoing is only illustrative of the principles of the invention, and that various modifications can be made by those skilled in the art without departing from the scope and spirit of the invention. For example, the numbers of various components included in the embodiments shown and described herein can be increased or decreased if desired. As another example of modifications within the scope of the invention, a device that employs the invention may be one-time programmable or reprogrammable, and/or it may be field programmable, mask programmable, or programmable in any other way.

The invention claimed is:

1. Programmable logic element grouping for use in multiple instances on a programmable logic device comprising:

first and second subgroups of plural programmable logic elements;

secondary signal selection circuitry for selecting plural candidate secondary signals from which each of the logic elements can select a final secondary signal;

a plurality of sources of primary signals for application to inputs of the logic elements, the sources including signals from outside the grouping and signals fed back from the logic elements; and programmable interconnection circuitry for applying selected ones of the primary signals to selected inputs of the logic elements, the interconnection circuitry limiting at least some of the primary signals to possible application to only the first subgroup of logic elements and limiting at least some others of the primary signals to possible application to only the second subgroup of logic elements.

2. The programmable logic element grouping defined in claim 1 wherein the at least some of the primary signals include the signals fed back from the logic elements in the first subgroup.

3. The programmable logic element grouping defined in claim 2 wherein the at least some others of the primary signals include the signals fed back from the logic elements in the second subgroup.

4. The programmable logic element grouping defined in claim 1 wherein the at least some of the primary signals include a first subplurality of the signals from outside the grouping.

5. The programmable logic element grouping defined in claim 4 wherein the at least some others of the primary signals include a second subplurality of the signals from outside the grouping.

6. The programmable logic element grouping defined in claim 1 wherein the programmable interconnection circuitry provides for possible application of still others of the primary signals to the first and second subgroups of logic elements.

7. The programmable logic element grouping defined in claim 6 wherein the still others of the primary signals include at least some of the signals fed back from the logic elements in at least one of the subgroups of logic elements.

8. The programmable logic element grouping defined in claim 7 wherein the at least some of the signals fed back from the logic elements include at least some of the signals fed back from the logic elements in the first subgroup, and wherein the programmable interconnection circuitry provides for possible application of the at least some of the signals fed back from the logic elements in the first subgroup to a greater percentage of the inputs to the logic elements in the first subgroup than to the inputs to the logic elements in the second subgroup.

9. The programmable logic element grouping defined in claim 8 wherein the at least some of the signals fed back from the logic elements further include at least some of the signals fed back from the logic elements in the second subgroup, and wherein the programmable interconnection circuitry further provides for possible application of the at least some of the signals fed back from the logic elements in the second subgroup to a greater percentage of the inputs to the logic elements in the second subgroup than to the inputs to the logic elements in the first subgroup.

10. The programmable logic element grouping defined in claim 6 wherein the still others of the primary signals include at least some of the signals from outside the grouping.

11. The programmable logic element grouping defined in claim 1 wherein the candidate secondary signals include a plurality of candidate clock signals.

12. The programmable logic element grouping defined in claim 1 wherein the candidate secondary signals include a plurality of candidate clock enable signals.

13. The programmable logic element grouping defined in claim 1 wherein the candidate secondary signals include a plurality of candidate clear signals.

14. Programmable logic element grouping for use in multiple instances on a programmable logic device comprising:
   first and second subgroups of plural programmable logic elements;
   secondary signal selection circuitry for selecting plural candidate secondary signals from which each of the logic elements can select a final secondary signal;
   a plurality of sources of primary signals for application to inputs of the logic elements, the sources including signals from outside the grouping and signals fed back from the logic elements; and
   programmable interconnection circuitry for applying selected ones of the primary signals to selected inputs of the logic elements, the programmable interconnection circuitry providing for possible application of at least some of the primary signals to a greater percentage of the inputs to the logic elements in the first subgroup than to the inputs to the logic elements in the second subgroup.

15. The programmable logic element grouping defined in claim 14 wherein the at least some of the primary signals include at least some of the signals fed back from the first subgroup.

16. The programmable logic element grouping defined in claim 15 wherein the programmable interconnection circuitry further provides for possible application of at least some others of the primary signals to a greater percentage of the inputs to the logic elements in the second subgroup than to the inputs to the logic elements in the first subgroup.

17. The programmable logic element grouping defined in claim 16 wherein the at least some others of the primary signals include at least some of the signals fed back from the second subgroup.

18. A LAB for a PLD comprising:
   a plurality of LEs divided into first and second subpluralities;
   SS selection circuitry; and
   programmable interconnection circuitry for selectively applying signals from outside the LAB and signals fed back from outputs of the LEs to inputs of the LEs, the programmable interconnection circuitry limiting possible application of at least some of said signals to one of the subpluralities.

19. The LAB defined in claim 18 further comprising:
   a plurality of multiplexers, each of which selects a signal for application to the programmable interconnection circuitry from a multiplicity of sources external to the LAB; and
   a sneak connection from an LE output to a selectable input of at least one of the multiplexers.

20. The LAB defined in claim 19 wherein the programmable interconnection circuitry limits possible application of the signal selected by the multiplexer having the sneak connection as an input to the subplurality that includes the LE having the sneak connection from its output.

21. The LAB defined in claim 19 wherein the programmable interconnection circuitry limits possible application of the signal selected by the multiplexer having the sneak connection as an input to the subplurality that does not include the LE having the sneak connection from its output.

22. An array of LABs, each of which is as defined in claim 18, and each of which further comprises:
   a plurality of multiplexers, each of which selects a signal for application to the programmable interconnection circuitry of the LAB from a multiplicity of sources external to the LAB; and
   wherein the array further comprises:
   a sneak connection from an LE output of a LAB to a selectable input of at least one of the multiplexers of another LAB.

* * * * *